US006253318B1

(12) United States Patent
Varghese et al.

(10) Patent No.: US 6,253,318 B1
(45) Date of Patent: Jun. 26, 2001

(54) METHOD OF DEVELOPING PHYSICAL REQUIREMENTS FOR COMPUTER CONFIGURATION

(75) Inventors: Manoj J. Varghese, Cypress; Christoph Schmitz, Tomball; Keith L. Kelley, Houston; Charles A. Bartlett, The Woodlands, all of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/126,025

(22) Filed: Jul. 29, 1998

(51) Int. Cl.[7] ..................................................... G06F 9/00
(52) U.S. Cl. .............................................. 713/1; 713/100
(58) Field of Search .......................................... 713/1, 100

(56) References Cited

U.S. PATENT DOCUMENTS

| 5,452,415 | | 9/1995 | Hotka ..................................... 395/161 |
| 5,515,524 | | 5/1996 | Lynch et al. .......................... 395/500 |
| 5,546,595 | * | 8/1996 | Norman et al. ....................... 395/800 |
| 5,603,043 | * | 2/1997 | Taylor et al. ......................... 395/800 |
| 5,640,595 | | 6/1997 | Baugher et al. ...................... 395/830 |
| 5,651,133 | * | 7/1997 | Burkes et al. ........................ 395/441 |
| 5,655,148 | * | 8/1997 | Richman et al. ..................... 395/828 |
| 5,668,995 | | 9/1997 | Bhat ..................................... 395/674 |
| 5,687,334 | * | 11/1997 | Davis et al. .......................... 395/339 |
| 5,708,769 | * | 1/1998 | Stallmo ............................. 395/182.04 |
| 5,740,436 | * | 4/1998 | Davis et al. .......................... 395/651 |
| 5,787,246 | * | 7/1998 | Lichtman et al. ................. 395/200.5 |
| 5,793,979 | * | 8/1998 | Lichtman et al. ............... 395/200.56 |
| 5,809,329 | * | 9/1998 | Lichtman et al. .................... 395/828 |
| 5,819,042 | | 10/1998 | Hansen ............................ 395/200.52 |
| 5,850,539 | * | 12/1998 | Cook et al. ........................... 395/500 |
| 5,892,681 | | 4/1999 | McDermith et al. ................ 364/488 |

OTHER PUBLICATIONS

Bonnie Carter et al., "Oracle System Sizer Getting Started For Compaq Windows NT Systems", Systems Release 2.3.1, pp. 1:2 to 1:5, 1996.*

Bonnie Carter et al., "Oracle System Sizer™ Getting Started for Compaq Windows NT Systems, Rel. 2.3.1," 1996, pp. 1:2–1:5.

* cited by examiner

*Primary Examiner*—Robert Beausoleil
*Assistant Examiner*—R. Ziemer
(74) *Attorney, Agent, or Firm*—Akin, Gump, Strauss, Hauer & Feld, LLP

(57) ABSTRACT

A method implemented according to the invention relates to a method including the conversion between of logical requirements and physical requirements, including such devices as computer drive arrays, controller/storage box combinations, and conversion of virtual disk drive heights to physical disk drive heights. The methods of the invention can be applied to the configuration of most hierarchical system.

21 Claims, 3 Drawing Sheets

METHOD OF DEVELOPING PHYSICAL REQUIREMENTS FOR COMPUTER CONFIGURATION

CROSS-REFERENCE TO RELATED APPLICATIONS

This application is related to the following copending, concurrently filed, and commonly assigned United States patent applications which are hereby incorporated by reference:

U.S. patent application Ser. No. 09/126,023, entitled "METHOD FOR DESCRIBING AND STORING DESCRIPTIONS OF HIERARCHICAL STRUCTURES" to Christoph Schinitz, Keith L. Kelley, Charles A. Bartlett, and Manoj J. Varghese;

U.S. patent application Ser. No. 09/126,022, entitled "SIZER FOR INTERACTIVE COMPUTER SYSTEM CONFIGURATION" to Charles A. Bartlett, Christoph Schinitz, Keith L. Kelley, and Manoj J. Varghese; and U.S. patent application Ser. No. 09/126,024, entitled "PRICE/PERFORMANCE BASED COMPUTER CONFIGURATION" to Keith L. Kelley, Christoph Schmitz, Charles A. Bartlett and Manoj J. Varghese.

BACKGROUND OF THE INVENTION

1. Field of the Invention

The present invention relates generally to a method for determining a computer's physical requirements from logical requirements and, more particularly, to a method including conversion of logical drive array requirements into physical array requirements, determination of controller/storage box combinations, and conversion of virtual disk drive heights to physical disk drive heights.

2. Description of the Related Art

The original computers were very complex devices that required skilled technicians and scientists to operate. When a new device, such as a printer, was added to the computer, special software and hardware needed to be developed specifically for the new device. With the advent of personal computers, it became impractical to require users to develop new software and hardware whenever new hardware was added.

Computer components eventually became standardized, and one of the important pieces of the puzzle was the Disk Operating System, or DOS. Originally DOS only supported a small number of devices such as printers, floppy drives, and hard disk drives. In addition, DOS was severely limited in the number of different computer configurations and components such as memory and peripherals that could be supported.

One advance in the computer arts was the arrival of "plug-and-play" architecture. Plug-and play means that a device can be added to a system without significant setup. This and other tools were the result of the standardization of interfaces which enables many devices to be easily configured to work together.

Today, the typical consumer and business user is presented with an astonishing number of choices with respect to the configuration of a new computer. A computer can be tailored to the particular needs of every user, from a multinational corporation with immense database requirements to an individual who only desires to log into the Internet. There are computers specialized to perform such tasks as bulk memory storage, communications, and game playing. Depending upon a user's needs, a computer can be configured with anywhere from 16 megabytes to hundreds of megabytes of random access memory (RAM). Static storage such as hard disk drives can vary in capacity from gigabytes ($10^9$ bytes) to terabytes ($10^{12}$ bytes) of data, each arranged in any one of a large number of configurations. Large amounts of RAM and static storage, however, cost proportionally more money. As a result, there is usually a tradeoff between price and performance.

The number of possible devices that can be added to any particular system has also grown. Computers now routinely come with devices that were unavailable even a few decades ago, such as speakers, CD-ROM drives, and fax modems. In addition, a user can add a large number of additional components such as tape drives, network cards, and specialized, game playing devices such as a joy stick. The number of possible choices for a computer system configuration is multiplied by the number of manufacturers that produce each component producing perhaps millions of possible systems.

SUMMARY OF THE INVENTION

Using a method implemented according to the invention, logical requirements are defined from physical requirements and physical requirements are derived from logical requirements. One embodiment of the invention involves the definition of logical drive array requirements from physical drive array requirements. The method also includes the conversion of logical drive array requirements into physical array requirements. Other embodiments may include the conversion of physical to logical and logical to physical requirements to determine controller/storage box combinations and disk drive/drive enclosure combinations.

For example, the method according to the invention allows the height of disk drives to be defined with considerations other than physical height, such as the space required between drives, to be taken into consideration when defining a disk drive for inclusion into a hardware description file (HDF) (see previously incorporated U.S. patent application entitled "Method For Describing And Storing Descriptions Of Hierarchical Structures") as used by an interactive configuration tool (a "sizer") (see previously incorporated U.S. patent application entitled "Sizer For Interactive Computer System Configuration").

To fit computer hard drives into a drive cage enclosure, one has to heed certain constraints, such as geometry and controller technology. The method according to the present invention produces "coefficients" that can be used to determine potentially unconfigurable, or illegal, drive combinations.

One method according to the present invention assigns to each hard drive type a virtual height. The drive enclosure is also assigned a virtual height. For example, a half size drive, or thick drive (1.6 inches), might be assigned a virtual height of 0.5 with respect to a particular drive enclosure of virtual height 1.0 (3.2 inches). A third height, or thin drive (1.0 inches), might be also be assigned a virtual height of 0.5 with respect to the drive enclosure because of mounting considerations. In the drive enclosure, three thin drives could not fit because the combined virtual heights of the three drives would be greater than the drive enclosure's virtual height of 1.0 (0.5+0.5+0.5=1.5, which is greater than 1.0). This limitation on the inclusion of thin drives can be realized even though it might seem apparent that three thin drives, each 1.0 inches thick, could fit into a drive enclosure that is 3.2 inches tall.

Apart from the geometry of drive enclosures, constraints can also be virtualized., such as the computer bus. For example, one SCSI channel can only address seven SCSI Ids. In a particular computer system, an available, internal drive enclosure might physically hold eight 1.0" drives. However, only seven drives could be addressed on one SCSI channel, so duplexing would be necessary to utilize all eight slots. These types of limitations are included in the virtualization of the enclosure so that the limitations are taken into account.

By defining the size and requirements of components in terms of virtual requirements, the computations of a sizer are simplified and the configuration of diverse components is generalized. It thus becomes possible to mix drives programmatically of different types within a single drive enclosure. The method according to the present invention can be applied to any set of components that are fitted within an enclosure. The virtualization of device size works on most other computer devices such as CD-ROM and tape drives, as well as non-computer devices such as an amplifier and other stereo components mounted in a rack.

DETAILED DESCRIPTION OF INVENTION

Figure 1:
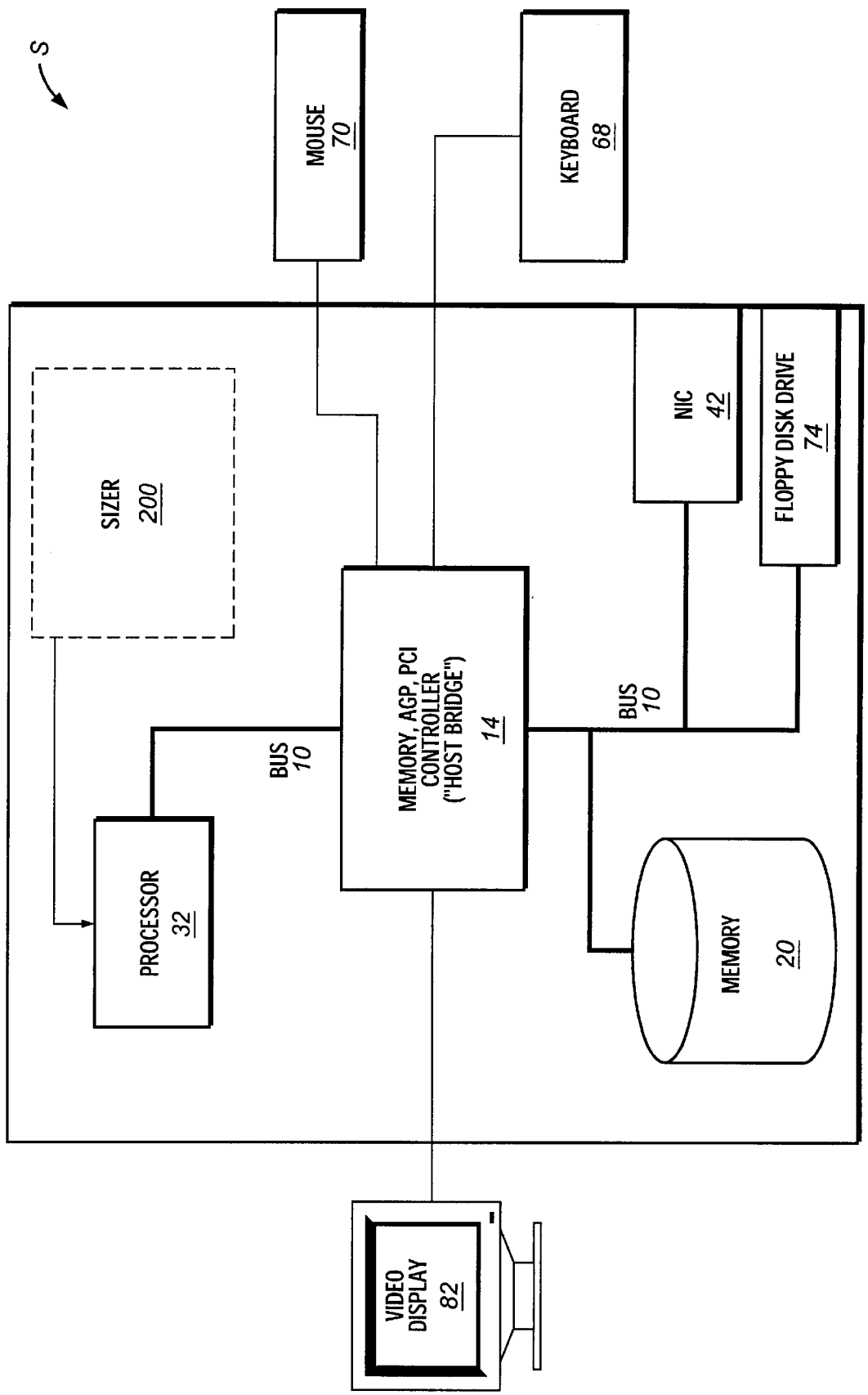
FIG. 1 is a block diagram of a computer system capable of being programmed in accordance with the present invention.

Turning to FIG. 1, illustrated is a typical computer system S in which the techniques according to the invention can be implemented. The computer system S in the illustrated embodiment is a PCI bus based machine, having a peripheral component interconnect (PCI) bus 10. The PCI bus 10 is controlled by PCI controller circuitry located within a memory/accelerated graphics port (AGP)/PCI controller 14. This controller 14 (the "host bridge") couples the PCI bus 10 to a processor 32 and a memory subsystem 20.

The host bridge 14 in the disclosed embodiment is a 440LX Integrated Circuit by Intel Corporation, also known as the PCI AGP Controller (PAC). The processor 32 is preferably a Pentium II. The processor 32 could be replaced with a different processor other than the Pentium II without detracting from the spirit of the invention.

The PCI bus 10 couples a variety of devices that generally take advantage of a high speed data path. This includes a network interface controller (NIC) 42, which preferably supports the ThunderLan™ power management specification by Texas Instruments, and a floppy disk drive 74. The floppy disk drive 74 preferably would be a 3½" floppy disk. A video display 82, a mouse 70, and a keyboard 68 can also be coupled to the host bridge 14, enabling interaction with the computer system S.

Finally, a sizer 200 (see FIG. 3) capable of utilizing the methods of the present invention would run on the processor 32 and utilize the other devices of computer system S. Such a sizer is further described in previously incorporated U.S. patent application entitled "Sizer For Interactive Computer System Configuration."

The computer system S illustrates only one platform in which the system according to the present invention can be implemented. The disclosed techniques can, without distracting from the spirit of the invention, be implemented in any device that executes computer programs, regardless of whether the device contains less, additional, or different components than the system in FIG. 1.

The Target System Configuration

Figure 2:
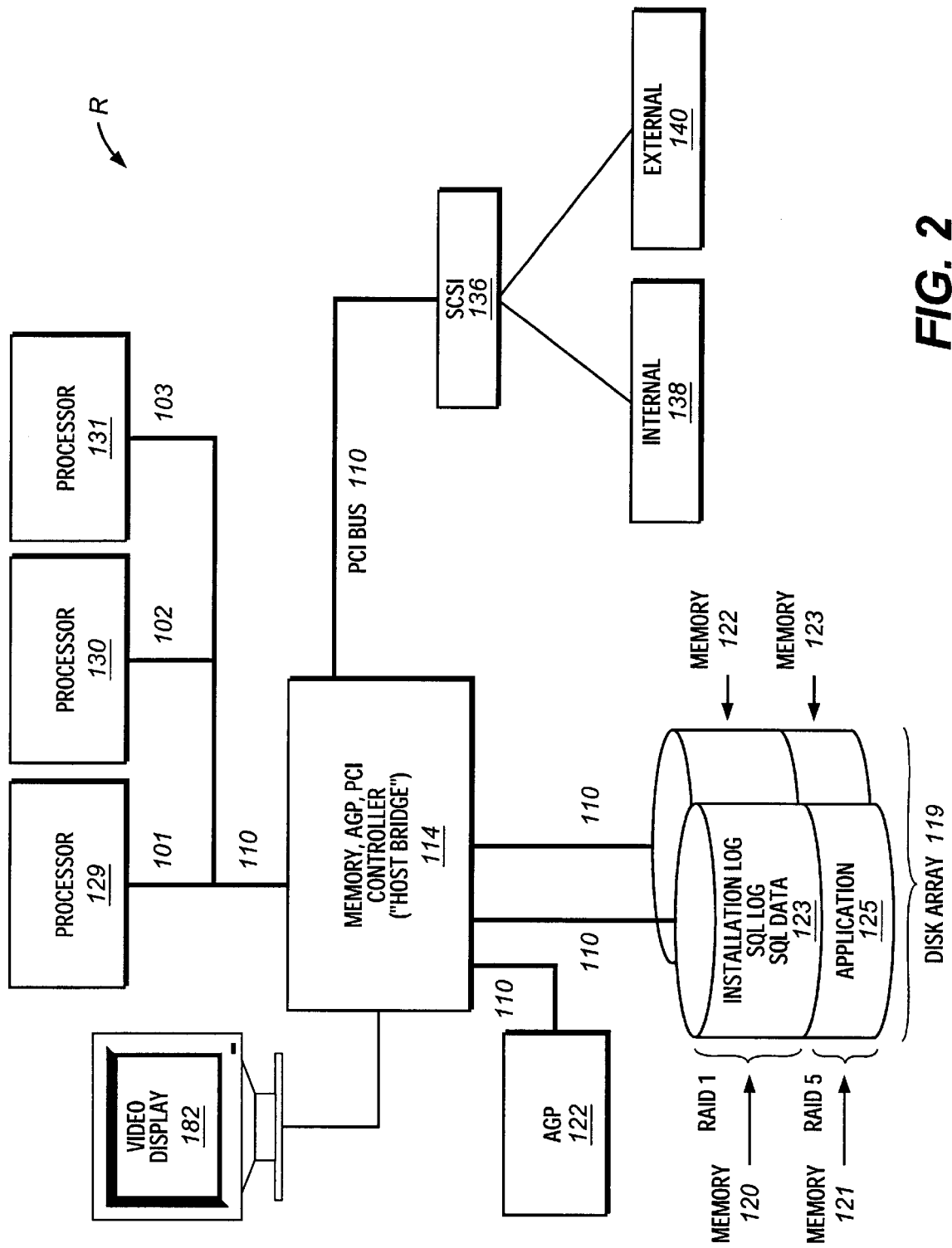
FIG. 2 is a block diagram of a computer system capable of being configured by an interactive computer system configuration device using the present invention.

Turning to FIG. 2, illustrated is a computer system R capable of being configured by a sizer 200 utilizing the present invention. The computer system R contains multiple processors 129, 130, and 131. The processors 129, 130, and 131 are each connected to their own host buses 101, 102, and 103 respectively, which in turn connect to a PCI bus 110. In one embodiment, the capacity of the buses 101, 102, 103, and 110 to support a number of processors can be virtualized. The PCI bus 110 might have a different logical size than the buses 101, 102, and 103 which are currently supporting a single processor. The logical size of the PCI bus 110 might indicate to a program such as a sizer 200 utilizing the present invention that the PCI bus 110 can support multiple processors and additional hardware. A logical size assigned to the buses 101, 102, and 103 might indicate to the sizer 200 that no additional hardware can be supported.

The PCI bus 110 is controlled by PCI controller circuitry located within a memory/accelerated graphics port (AGP)/PCI controller 114. This controller 114 (the "host bridge") couples also the PCI bus 110 to four memory subsystems 120–23. The PCI bus 110 couples a variety of devices that generally take advantage of a high speed data path. This includes a small computer system interface (SCSI) controller 136, with both an internal port 138 and an external port 140. In addition, a video display 182 can be coupled PCI controller 114 for display of data by the computer system R. In one embodiment, the capacity of the control 114 can be virtualized allowing a program utilizing the present invention to determine combinations of devices that can be supported, each possibly with different requirements and therefor different logical sizes.

There is a relatively loose connection between the computer system R and the memory subsystems 120–123. The major constraint includes the number of controllers 114 which can be installed in the computer system R. In one embodiment, both the number of controllers and the variations among individual controllers can be derived from logical requirements. The logical requirements may take the form of hardware description files 208–214 (HDF) (see FIG. 3). The logical requirements may incorporate additional constraints such as a user-defined PCI slot reservation for non-performance related expansions such as NICs or a Remote Insight Board.

The sizer 200 uses drive capacity and performance information to configure the storage subsystems 120–123. The sizer framework 206 (see FIG. 3) maintains a list of available hard drives defined using logical requirements. The maximum and recommended I/O rates, which are specific to an application, may be maintained by the application sizer 202 (see FIG. 3) or derived by the sizer 200 from basic performance information maintained by the sizer framework 206 (rpm and seek time). As in other subsystems, the sizer framework 206 supports increment/decrement operation and may constrain selections.

The sizer 202 utilizes the hard drive information to properly arrange the data areas into a set of drive arrays which are included in the recommendation provided to the sizer framework 206. Each drive array includes: the hard drive selected for the array, the number of drives in the array, the capacity configured for each of the RAID levels (0, 1, and 5), and a description of the drive array contents.

The sizer defines a set of disk models which configure the data areas into drive arrays. Each disk model assigns the RAID levels for the data areas and maps the data areas to the drive arrays. The appropriate hard drive selection and drive quantity is made based on hard drive capacity and performance information. Each disk model has a range of drive quantities that are appropriate for its use; some disk models may be rejected by the sizer 202 due to this constraint.

The computer system R illustrates only one platform which the sizer 200 utilizing the present invention can configure. The disclosed techniques can, without distracting from the spirit of the invention, be implemented on any device that has a hierarchical structure, regardless of whether the structure contains less, additional, or different components than the system in FIG. 2. The device configured by means of the present invention does not need to be a computer, but might be a device such as a rack mounted, custom stereo system.

The Sizer Framework Configuration

Figure 3:
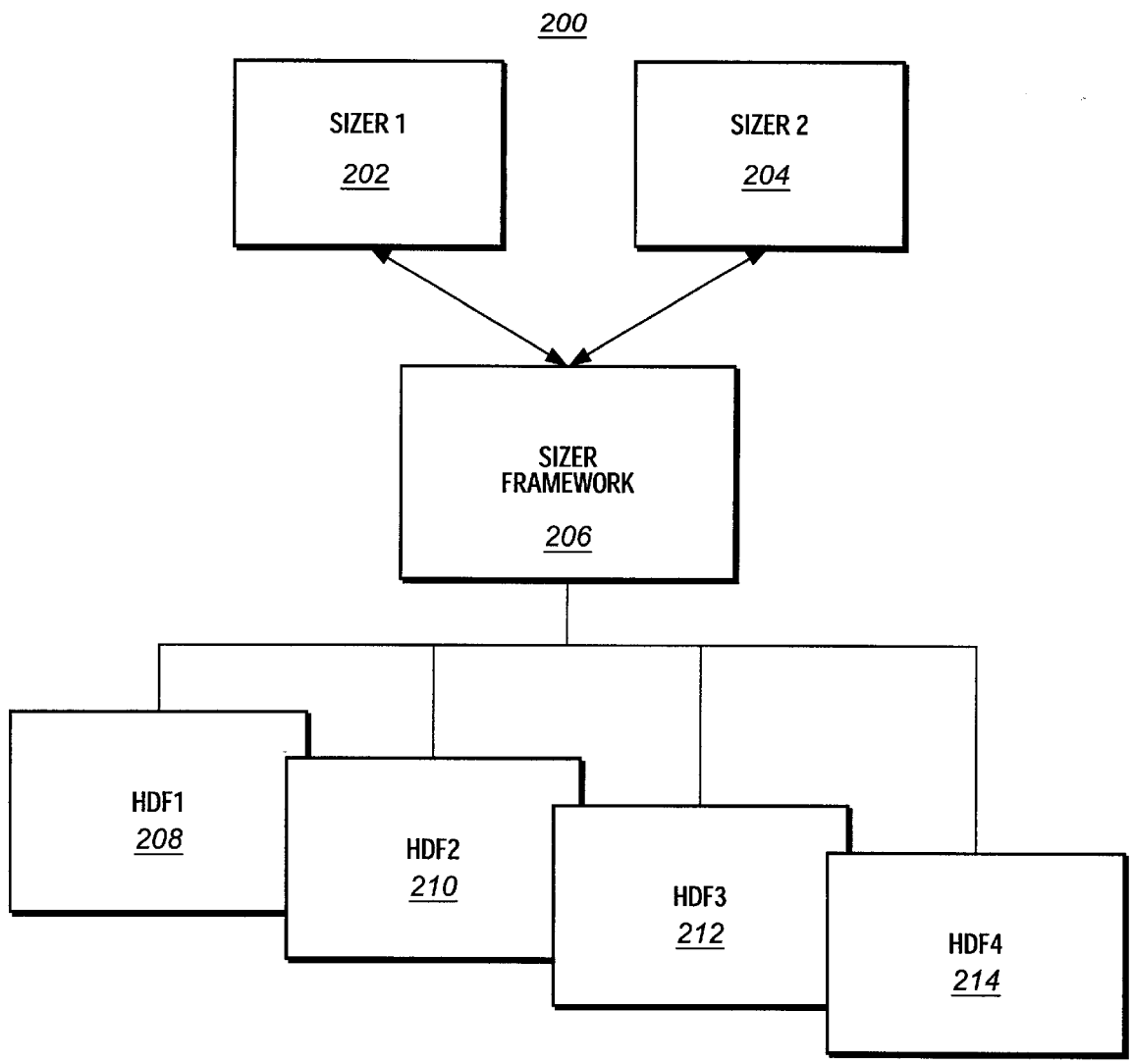
FIG. 3 is a block diagram of a computer system configuration program, or sizer, including application specific sizer modules, a sizer framework, and hardware definition files.

Turning now to FIG. 3, illustrated is a sizer, complete with application sizer modules 202 and 204, a sizer framework 206, and hardware description files (HDFs) 208–214. The application sizer modules 202 and 204 are designed individually for a specific application such as a computer designated as a Microsoft SQL server, a Microsoft NT server, or an Oracle database server. The sizer framework 206 contains the functionality common to current or future application sizers. This design enables a software developer to build an application sizer without the need of recreating or rewriting the common functionality such as the graphical user interface (GUI).

The HDFs 208–214 are read in by the sizer framework 206 and contain descriptions of all hardware available to be configured into a computer system. Examples of hardware that may be described in a HDF 208 are memory chips, hard disks, network interface cards 42 (NICs), memory controllers 14 and 114, and CD-ROM drives. The application sizer 202 or 204 may not need all the descriptions read into memory from the HDFs 208–241 but the sizer framework 206, not knowing what a specific application sizer 202 or 204 needs, reads in all that are available. The application sizers 202 and 204 have no direct connection with the HDFs 208–214, but instead rely on the sizer framework 206 for information on available hardware which the framework 206 has obtained from the HDFs 208–214.

The set of framework services can be viewed as being two tiered, the lower level contains the infrastructure services 420 while the upper layer support application features 408 like navigation 410 and report management 412 which are directly visible to the user.

The framework will support both sizer and non-sizer clients. For example, data collection pieces directly supported by the framework can be termed non sizer clients 422 and 424. The partition of the application space will allow for a single plug in interface with a two way split.

Individual sizers 202 will be developed by deriving from a core set of frame work classes, and further specializing, member functions, or overriding functionality, already provided by the framework. The framework APIs 406 are the glue that enables all the components to work together. Specific infrastructure 420 functionality is exposed, to a sizer 202, via the APIs 406 The Diagrams 1–3 illustrate one embodiment of the present invention; a sizer using HDF's. The following definitions provide a formal description that can be applied to most any hierarchical system. The use of the term "drive" is illustrative of one embodiment only.

Drive Height Fitting

The method of drive height fitting can be described using the following definitions.

DEFINITION 1 Suppose we are given η different drive types and a drive enclosure E.

The set of feasible drive combinations defined as:

$C_E = \{I = (I_1, \ldots, I_n) \in IN^n | I_1 \text{ Type 1 drives}, \ldots, I_n \text{ Typedrives fit in E}\}$ The tuple of optimal components is defined as:

$CE = (C_1, \ldots, C_n)$ where E maximally fits $C_1$ drives of Type 1, ..., $C_n$ drives of Type η.

In one embodiment, the goal is to find suitable virtual heights of drive types and enclosure. For example, in a disk mirroring configuration, disk drives are added in pairs and might have a logical height twice as large as a disk in non-mirrored configuration. Another embodiment might involve possible controller/storage box combinations using slots available instead of height of the enclosure and number of slots required by a device or reserved instead of drive heights DEFINITION 2 Suppose one is given a different drive types and a drive enclosure E.

The set of suitable virtual height combinations is defined as:

$HE = \{(h_1, \ldots, h_n, h) \in IN^{n+1} | h_1 I_1 + + h_n I_1 \leq h \ \forall I \in C_E, h \ c > h \ \forall c \in C_E \}$ This set might be potentially empty or can have infinitely many solutions. It is sufficient to produce one representative from the set (if not empty). This can be achieved by the following integer linear program (ILP):

Given drive enclosure E, search for $(h_1, \ldots, h_n, h) \in IN^{n+1}$ min h, s.t $h_1 I_{1++/n} I_n \leq h \ \forall I \in C_E h_1 C > h \ \forall C \in C_E$ This is a problem that can be solved in finite time, unfortunately an ILP is recognized as an NP complete problem, a class of inherently hard problems. However the problem instances arising in the embodiment illustrated in FIGS. 1–3 is small, such that solutions might even be found by hand.

The described method very efficiently tests whether a certain combination $(t_1, \ldots, t_i)$ of drive types can be fit into a drive enclosure:

Drives Fit if and only if $t_1 h_1 + \ldots + t_n h_n \leq h$

Although this equation will determine appropriate fits within an enclosure, this equation can be extended to higher order terms, such as if rather than height, area occupied is an issue. For example, if a drive face occupies a certain amount of area, the following type of higher order equation could be employed:

$t_1 h_1^2 + t_1 h_1 + t_2 h_1^2 + t_2 h_2 \ldots \leq h^2$

Figure 4:
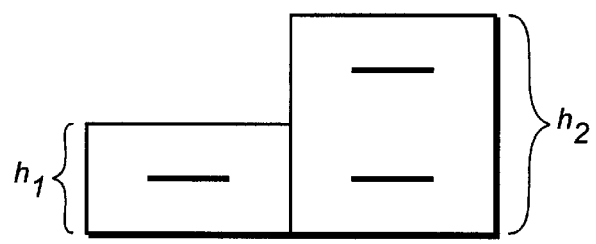
FIG. 4 illustrates a logical fit calculation using more complex geometries.

Further, if both heights and widths are known, both heights and widths can be factored into the equation. In any case, an example of such a more complex geometry is illustrated and attached to FIG. 4.

The methods of the present invention can be applied the configuration of most hierarchical systems. In addition to the example of drive/drive cage configuration, the method, as described formally can be utilized to configure a number of systems such as custom, rack-mounted stereo system.

The drive height fitting in virtualization of drive heights, as well as the use of the techniques to convert drive array requirements into physical arrays of drives and to find possible combinations of controllers and external drive cages, are further defined and described in the attached source code appendix. In any case, the use of virtualization and the disclosed fitting algorithm can be applied to a variety of configurations other than hard drive--drive cage configurations.

What is claimed is:

1. A system for selecting a hard drive-drive cage configuration, the system comprising:
   a processor; and
   a configuration sizer tool executed by the processor to maintain logical requirement information and performance information for a plurality of hard drives, the logical requirement information including a list of available hard drives of different disk models with differing requirements, and to determine an appropriate hard drive-drive cage configuration based on the logical requirement information and the performance information,
   wherein virtual heights for the plurality of hard drives are fitted to a virtual height for a hard drive cage in determining the appropriate hard drive-drive cage configuration.

2. The system of claim 1, wherein the hard drive and drive cages are virtualized and fit according to an algorithm in which virtual hard drive heights are fit into virtual drive cage heights by searching for sets in which combinations of virtual hard drive heights are less than the virtual drive cage heights.

3. The system of claim 2, wherein the configuration sizer tool includes a configuration sizer framework and a configuration sizer specific to a particular class of computer products.

4. The system of claim 1, wherein the configuration sizer tool includes a configuration sizer framework and a configuration sizer specific to a particular class of computer products.

5. A system for selecting configurations of computer components, the system comprising:
   a processor; and
   a configuration sizer tool executed by the processor to maintain logical requirement information and performance information for a plurality of computer components of a first type, the logical requirement information including a list of available computer components of a first type of different models with differing requirements, and to determine an appropriate system configuration based on the logical requirement information and the performance information,
   wherein virtual heights for a plurality of computer components of a first type are fitted to a virtual height for computer components of a second type in determining the appropriate system configuration.

6. The system of claim 5, wherein the particular types of components are hard drives and the second type of component is a drive cage, and hard drive height is virtualized relative to the height of the drive cage.

7. The system of claim 6, wherein the configuration sizer tool includes a configuration sizer framework and a configuration sizer specific to a particular class of computer products.

8. The system of claim 5, wherein the configuration sizer tool includes a configuration sizer framework and a configuration sizer specific to a particular class of computer products.

9. The system of claim 5, wherein the particular types of components are drives, and the second type of components are drive controllers, and wherein the characteristic that is virtualized is number of available channels.

10. The system of claim 9, wherein the configuration sizer tool includes a configuration sizer framework and a configuration sizer specific to a particular class of computer products.

11. Computer executable code stored on machine readable media for selecting configurations of computer components, the computer executable code comprising:
   a configuration sizer tool executed by the processor to maintain logical requirement information and performance information for a plurality of hard drives, the logical requirement information including a list of available hard drives of different disk models with differing requirements, and to determine an appropriate hard drive-drive cage configuration based on the logical requirement information and the performance information,
   wherein virtual heights for the plurality of hard drives are fitted to a virtual height for a hard drive cage in determining the appropriate hard drive-drive cage configuration.

12. The computer executable code of claim 11, wherein the hard drive and drive cages are virtualized and fit according to an algorithm in which virtual hard drive heights are fit into virtual drive cage heights by searching for sets in which combinations of virtual hard drive heights are less than the virtual drive cage heights.

13. The computer executable code of claim 12, wherein the configuration sizer tool includes a configuration sizer framework and a configuration sizer specific to a particular class of computer products.

14. The computer executable code of claim 11, wherein the configuration sizer tool includes a configuration sizer framework and a configuration sizer specific to a particular class of computer products.

15. A computer executable code, stored in a memory and executed by a processor, for selecting for selecting configurations of computer components, comprising:
   a configuration sizer tool maintain logical requirement information and performance information for a plurality of computer components of a first type of different models with differing requirements, and to determine an appropriate system configuration based on the logical requirement of information and the performance information,
   wherein virtual heights for a plurality of computer components of a first type are fitted to a virtual height for computer components of a second type in determining the appropriate system configuration.

16. The computer executable code of claim 15, wherein the particular types of components are hard drives and the second type of component is a drive cage, and hard drive height is virtualized relative to the height of the drive cage.

17. The computer executable code of claim 16, wherein the configuration sizer tool includes a configuration sizer framework and a configuration sizer specific to a particular class of computer products.

18. The computer executable code of claim 15, wherein the configuration sizer tool includes a configuration sizer framework and a configuration sizer specific to a particular class of computer products.

19. The computer executable code of claim 15, wherein the particular types of components are drives, and the second type of components are drive controllers, and wherein the characteristic that is virtualized is number of available channels.

20. The computer executable code of claim 19, wherein the configuration sizer tool includes a configuration sizer framework and a configuration sizer specific to a particular class of computer products.

21. A method of selecting system configuration comprising the steps of:

providing a configuration sizer tool to develop an appropriate system configuration based on logical requirement information and performance information;

calculating performance characteristics for candidate systems that satisfy the logical requirement information and the performance information specified by a user, including determining an appropriate hard drive-drive cage configuration by comparing the logical requirement information and performance information of a plurality of hard drives; and displaying the candidate systems to the user.

* * * * *

UNITED STATES PATENT AND TRADEMARK OFFICE
CERTIFICATE OF CORRECTION

PATENT NO.     : 6,253,318 B1
DATED          : June 26, 2001
INVENTOR(S)    : Manoj J. Varghese et al.

It is certified that error appears in the above-identified patent and that said Letters Patent is hereby corrected as shown below:

Column 9,
Line 4, delete "of." and insert therefor -- of: --.

Signed and Sealed this

Eighth Day of November, 2005

JON W. DUDAS
*Director of the United States Patent and Trademark Office*